United States Patent [19]

Schuh

[11] Patent Number: 4,502,069

[45] Date of Patent: Feb. 26, 1985

[54] CONTACT FOR AN MIS-SEMICONDUCTOR COMPONENT AND METHOD FOR MANUFACTURING THE SAME

[75] Inventor: Gottfried Schuh, Munich, Fed. Rep. of Germany

[73] Assignee: Siemens Aktiengesellschaft, Berlin and Munich, Fed. Rep. of Germany

[21] Appl. No.: 258,367

[22] Filed: Apr. 28, 1981

[30] Foreign Application Priority Data

Apr. 30, 1980 [DE] Fed. Rep. of Germany ....... 3016749

[51] Int. Cl.³ ............... H01L 29/78; H01L 29/06; H01L 23/48; H01L 29/44
[52] U.S. Cl. ................. 357/23.4; 357/23.8; 357/23.9; 357/55; 357/65; 357/68
[58] Field of Search ............ 357/22, 55, 65, 68, 357/38, 86, 23 VD, 23 R, 88, 23 S, 23 HV, 23 D, 23 MG

[56] References Cited

U.S. PATENT DOCUMENTS

| | | | |
|---|---|---|---|
| 4,003,126 | 1/1977 | Holmes et al. | 357/55 |
| 4,035,826 | 7/1977 | Morton et al. | 357/42 |
| 4,080,620 | 3/1978 | Chu | 357/55 X |
| 4,160,986 | 7/1979 | Johnson | 357/55 X |
| 4,219,835 | 8/1980 | van Loon et al. | 357/56 |
| 4,247,788 | 1/1981 | Bluzer | 357/22 X |
| 4,315,271 | 2/1982 | Roger | 357/86 |
| 4,325,169 | 4/1982 | Ponder et al. | 357/42 |

OTHER PUBLICATIONS

IEEE Transaction on Electron Devices, vol. ED-27, No. 2, Feb. 1980, p. 384, FIG. 9, p. 380.

Primary Examiner—Andrew J. James
Assistant Examiner—J. Carroll
Attorney, Agent, or Firm—Herbert L. Lerner; Laurence A. Greenberg

[57] ABSTRACT

An MIS-semiconductor component, includes a substrate having a surface, a first zone of a given first conductivity type embedded in the substrate, a second zone of a given second conductivity type embedded in the first zone, at least one insulating layer disposed on the substrate surface, a contact, and an auxiliary zone surrounding at least part of the contact and being of the second conductivity type and more heavily doped than the second zone. The at least one insulating layer and the second zone have a hole formed therein. The contact is connected to the first zone through the hole and is electrically connected to the second zone through the hole and the auxiliary zone.

4 Claims, 5 Drawing Figures

CONTACT FOR AN MIS-SEMICONDUCTOR COMPONENT AND METHOD FOR MANUFACTURING THE SAME

BACKGROUND OF THE INVENTION

1. Field of the Invention

The invention relates to an MIS-semiconductor component with a substrate in which a first zone of a first conduction or conductivity type is embedded; a second zone of a second conduction type which is embedded in the first zone; at least one insulating layer lying on the substrate surface; and a contact making connection with the first and the second zone through a hole formed in the insulating layer.

2. Description of the Prior Art

Such a semiconductor component has already been described in the form of an MOS field-effect transistor with a vertical structure. In that structure, the first zone forming the channel zone and the second zone forming the source lie at the surface of the substrate, while the drain zone covers the substrate on the underside over a large surface. To obtain good electrical properties, such as a low set-in voltage, the channel must be kept short. The second zone forming the source zone must also be made very thin. In addition, it cannot be doped very heavily because otherwise diffusion under the insulating layer serving as the masking would occur. Thus, the channel length can no longer be made reproducible.

Contacting such a thin, relatively weakly doped layer with the aluminum or an aluminum-silicon alloy normally used as the contact now presents difficulties, particularly if the source zone is n-conducting, since aluminum in silicon has a p-doping effect.

SUMMARY OF THE INVENTION

It is accordingly an object of the invention to provide a contact for an MIS-semiconductor component and method for manufacturing the same, which overcomes the hereinafore-mentioned disadvantages of the heretofore known devices of this general type, and to do so in such a manner that perfect contacting of even relatively weakly doped thin zones is possible with a metal which would cause the opposite doping in silicon.

With the foregoing and other objects in view there is provided, in accordance with the invention, an MIS-semiconductor component, comprising a substrate having a surface, a first zone of a given first conductivity type embedded in the substrate, a second zone of a given second conductivity type embedded in the first zone, at least one insulating layer disposed on the substrate surface, a contact, an auxiliary zone surrounding at least part of the contact and being of the second conductivity type and more heavily doped than the second zone, the at least one insulating layer and second zone having a hole formed therein, the contact being connected to the first zone through the hole and being electrically connected to the second zone through the hole and the auxiliary zone.

In accordance with another feature of the invention, the hole extends into the first zone.

In accordance with a further feature of the invention, the auxiliary zone is thicker than the second zone.

In accordance with an added feature of the invention, the contact also contacts the auxiliary zone at the substrate surface.

In accordance with a concomitant mode of the invention, there is provided a method for fabricating an MIS-semiconductor component which comprises:

(a) diffusing a control part of a p-conducting planar first zone into an n-conducting substrate leaving a part of the substrate unchanged, (b) generating a first insulating layer of silicon dioxide on the entire surface of the substrate, (c) applying a control electrode of n-doped polycrystalline silicon on the first insulating layer covering part of the unchanged part of the substrate, (d) generating a channel zone in the substrate by ion bombardment and subsequent temperature treatment, (e) generating a second zone in the first zone by ion bombardment and subsequent temperature treatment, (f) applying a second insulating layer of silicon dioxide on the entire surface of the first insulating layer and the control electrode, (g) etching through both insulating layers to the surface of the second zone exposing part of the second zone and leaving part covered by the insulating layers, (h) heating the entire surface of the second zone and insulating layers in a phosphorus-containing atmosphere until the exposed part of the second zone is doped more heavily than the part covered by the insulating layers, (i) etching a contact hole into the more heavily doped part of the second zone until the surface of the first zone is exposed, and (j) applying a contact layer of the entire surface of the component.

Other features which are considered as characteristic for the invention are set forth in the appended claims.

Although the invention is illustrated and described herein as embodied in a contact for an MIS-semiconductor component and method for manufacturing the same, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

DESCRIPTION OF THE PREFERRED EMBODIMENT

Figure 1:
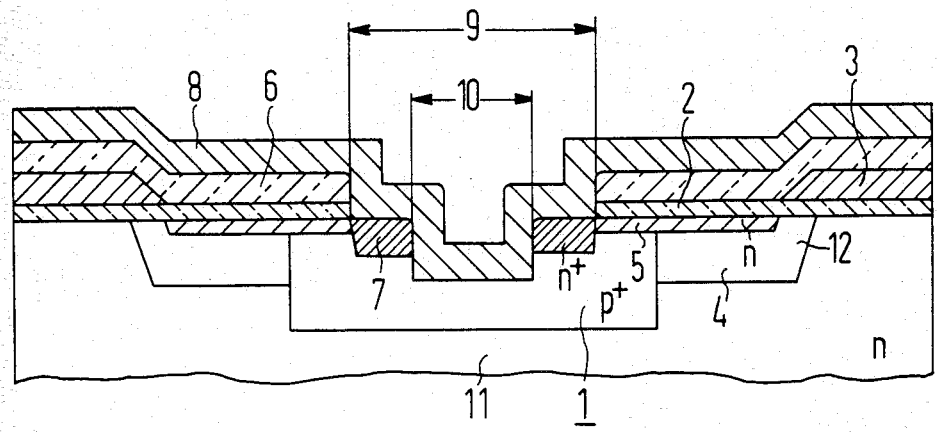
FIG. 1 is a fragmentary diagrammatic cross-sectional view of a finished MIS-FET (field-effect transistor)

Referring now to the figures of the drawing and first particularly to FIG. 1 thereof, it is seen that the FET has an n-conducting substrate 11 in which a p-conducting first zone 1 is embedded in a planar manner. A second zone 5 is a source zone and is embedded in planar fashion in the first zone 1 forming the source. The second zone 5 is n-conducting. The surface of the substrate is covered with a first insulating layer 2 which ordinarily is formed of silicon dioxide $SiO_2$. The first zone 1 has a section 4 which emerges to the surface of the substrate and there forms a channel zone 12. The channel zone 12 and the part of the substrate 11 which has remained unchanged is covered with a control electrode 3 which is built up from n-doped polycrystalline silicon. The insulating layer 2 and the control electrode 3 are covered with a second insulating layer 6, which may likewise be an SiO$_2$ layer. The second zone 5 is connected to an auxiliary zone 7 which has the same conduction or conductivity type as the second zone 5 but is doped more heavily than the zone 5. In the embodiment example, the auxiliary zone 7 is heavily n-doped. The entire surface of the FET is covered with an ohmic contact layer 8 which may be formed of aluminum or an aluminum-silicon alloy. The contact layer 8 makes contact with the zone 1 through a contact hole 10. The auxiliary zone 7 is contacted at the circumference thereof through the same contact hole 10 and at the surface through a contact hole 9 which is opened in the insulating layers 2 and 6. Through the auxiliary zone 7, perfect contact between the contact layer 8 and the source 5 is achieved.

The FET according to FIG. 1 is advantageously fabricated as follows.

Figure 2:
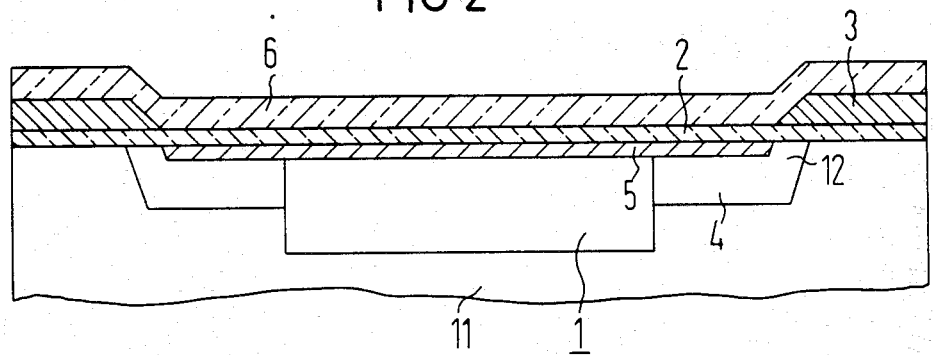
FIGS. 2 to 5 are views similar to FIG. 1 showing the MIS-FET during various successive process steps.

First, the low central portion of the first zone 1 is diffused into the n-conducting substrate 11 as shown in FIG. 2. The diffusion can be generated in the usual manner by photomasking or by bombardment with boron ions and subsequent injection into the substrate. Subsequently, the substrate is covered, over the whole surface thereof, with the silicon dioxide layer 2. Then, the control electrode 3 is applied on the layer 2 in such a manner that it does not cover the central part of the zone 1. The control electrode is formed of n-conducting polycrytalline silicon which is precipitated from a gaseous compound of the silicon. The control electrode 3 is etched at an angle at the flanks thereof. The section 4 of the first zone with the control zone 12 is thereupon made by bombardment with boron ions and correspondingly less deep injection into the substrate. The control electrode acts as a mask for the ion bombardment so that the form of the channel zone which is shown in the figures as being inclined toward the surface of the substrate, is obtained. Subsequently, the second zone 5 is generated by implantation and driving in arsenic ions, for instance. Then the entire surface is provided with a second insulating layer of silicon dioxide. For this purpose, silicon can again be precipitated from a gaseous compound of silicon on the surface and converted into the silicon dioxide by subsequent oxidation.

Figure 3:
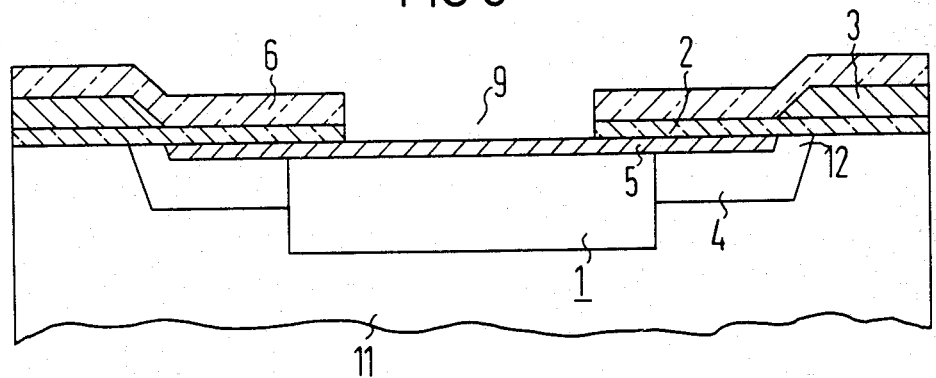
Figure 4:
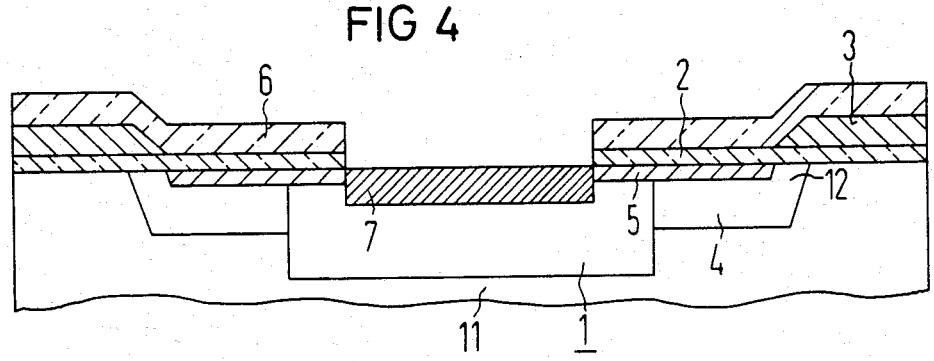

In FIG. 3 it is shown that the contact hole 9 is etched into the insulating layers 2 and 6. The etching process is interrupted when the surface of the second zone 5 is exposed. Subsequent thereto, with reference to FIG. 4, the entire surface of the arrangement is subjected to a phosphorus-containing atmosphere at high temperature. On one hand, this results in the exposed part of the second zone being doped more heavily and driven more deeply into the first zone 1. This part forms the auxiliary zone 7. On the other hand, the temperature treatment in the phosphorus-containing atmosphere forms edges around, and fills up fault locations in, the second insulating layer 6. This has found use in semiconductor technology as the "Oxide-Reflow"-process.

Figure 5:
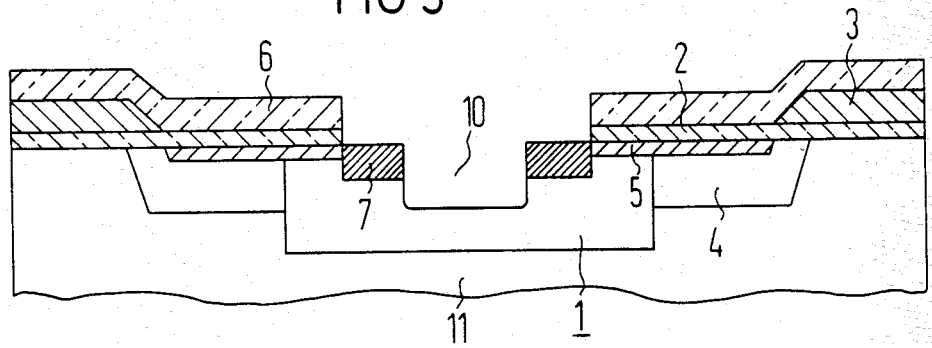

As is evident from FIG. 5, the contact hole 10 is subsequently etched into the zone 7 in such a manner that it is surrounded on all sides by the rest of the auxiliary zone 7. The etching can be pushed so far that the contact hole is deeper than the thickness of the auxiliary zone 7, but this is not absolutely necessary. It is also not absolutely necessary for the auxiliary zone 7 to be thicker than the second zone 5. To obtain good ohmic contact, it is merely necessary for the auxiliary zone 7 to be doped more heavily than the zone 5. After the recess 10 is etched, the surface of the entire arrangement is provided with a layer of aluminum or an aluminum-silicon alloy, as shown in FIG. 1. This ensures perfect contact with the source of the FET.

The auxiliary zone 7 can have, for instance, a doping of about $3 \times 10^{20}$ cm$^{-3}$ and a depth of from 0.5 to 1 $\mu$m. The thickness of the zone 5, on the other hand, can be around 0.15 to 0.2 $\mu$m. The doping can be 1 to $5 \times 10^{18}$ cm$^{-3}$. This is set by arsenic implantation with an energy of 120 keV and a dose of $5 \times 10^{14}$ cm$^{-2}$.

The invention was described through the example of an FET. However, it is also applicable to thyristors and triacs which are controlled by the field effect, and in general to all kinds of vertical MIS-structures.

I claim:

1. MIS-semiconductor component comprising:
   (a) a substrate having a surface;
   (b) a zone of a given first conductivity type embedded in said substrate;
   (c) a source zone of a given second conductivity type embedded in said zone of a given first conductivity;
   (d) at least one insulating layer disposed on said substrate surface;
   (e) an ohmic contact;
   (f) an auxiliary zone surrounding at least part of said contact, being of said second conductivity type, being embedded in said zone of first conductivity and more heavily doped than said source zone;
   (g) said at least one insulating layer and said auxiliary zone having a hole formed therein;
   (h) said contact being connected to said zone of first conductivity through said hole of said auxiliary zone;
   (i) said contact being electrically connected to said source zone through said auxiliary zone; and
   (j) a channel zone of a first conductivity type disposed between said substrate and said source zone.

2. Semiconductor component according to claim 1, wherein said hole extends into said zone of a given first conductivity type.

3. Semiconductor component according to claim 1, wherein said auxiliary zone is thicker than said source zone.

4. Semiconductor component according to claim 1 or 3, wherein said contact also contacts said auxiliary zone at said substrate surface.

* * * * *